(12) United States Patent  (10) Patent No.: US 7,876,120 B2
Awaji et al.  (45) Date of Patent: Jan. 25, 2011

(54) TEST APPARATUS, PIN ELECTRONICS CARD, ELECTRICAL DEVICE AND SWITCH

(75) Inventors: Toshiaki Awaji, Tokyo (JP); Takashi Sekino, Tokyo (JP); Masakazu Ando, Tokyo (JP)

(73) Assignee: Advantest Corporation (JP)

( * ) Notice: Subject to any disclaimer, the term of this patent is extended or adjusted under 35 U.S.C. 154(b) by 88 days.

(21) Appl. No.: 12/060,242

(22) Filed: Mar. 31, 2008

(65) Prior Publication Data

US 2009/0134900 A1  May 28, 2009

Related U.S. Application Data

(63) Continuation of application No. PCT/JP2006/320129, filed on Oct. 6, 2006.

(30) Foreign Application Priority Data

Oct. 12, 2005 (JP) .............................. 2005-297823
Oct. 6, 2006 (WO) ................. PCT/JP2006/320129

(51) Int. Cl.
*G01R 31/02* (2006.01)
(52) U.S. Cl. ...................................................... 324/763
(58) Field of Classification Search ..................... None
See application file for complete search history.

(56) References Cited

U.S. PATENT DOCUMENTS 6,020,752 A * 2/2000 Shimasaki ................... 324/765
6,505,315 B1 1/2003 Kojima
6,670,597 B1 12/2003 Kitamura et al.
6,813,133 B2 11/2004 Yasuoka et al.
7,013,230 B2 * 3/2006 Sekino ........................ 324/763

(Continued)

FOREIGN PATENT DOCUMENTS

JP  H10-144189 A  5/1998

(Continued)

OTHER PUBLICATIONS

German Office Action in counterpart application DE 11 2006 002 853.7-35, dated Mar. 10, 2010, citing U.S. Patent No. 1 listed above and JP2000-009804 which has been submitted in a previous IDS. Translation of the Office Action is attached as a concise explanation of relevance.

(Continued)

*Primary Examiner*—Jermele M Hollington
(74) *Attorney, Agent, or Firm*—Chen Yoshimura LLP (57) ABSTRACT

Provided is a test apparatus for testing a device under test, the test apparatus including: a pattern generating section that inputs a test pattern to the device under test; a judging section that receives an output signal of the device under test, and makes judgment concerning pass/fail of the device under test based on the output signal; an internal circuit that exchanges signals between the device under test and the pattern generating section or the judging section; a first transmission line that connects the internal circuit to the device under test; and a first switch that connects the first transmission line to a ground potential in not testing the device under test, and cuts off the first transmission line from the ground potential in testing of the device under test.

10 Claims, 10 Drawing Sheets

U.S. PATENT DOCUMENTS

| | | | |
|---|---|---|---|
| 7,132,844 B2 * | 11/2006 | Hashimoto | 324/765 |
| 7,256,600 B2 * | 8/2007 | Walker et al. | 324/763 |
| 2002/0093359 A1 * | 7/2002 | Babcock | 324/765 |
| 2004/0022044 A1 | 2/2004 | Yasuoka et al. | |
| 2004/0145375 A1 * | 7/2004 | Sekino | 324/600 |
| 2005/0264105 A1 * | 12/2005 | Kawata | 307/106 |
| 2006/0132166 A1 * | 6/2006 | Walker et al. | 324/765 |
| 2006/0170517 A1 * | 8/2006 | Nakamura et al. | 340/538.11 |
| 2007/0136628 A1 * | 6/2007 | Doi et al. | 714/718 |
| 2010/0001776 A1 * | 1/2010 | Nakamura et al. | 327/252 |
| 2010/0030508 A1 * | 2/2010 | Gake | 702/117 |
| 2010/0213966 A1 * | 8/2010 | Kojima | 324/765 |

FOREIGN PATENT DOCUMENTS

| | | |
|---|---|---|
| JP | 11-064436 | 3/1999 |
| JP | 2000-009804 | 1/2000 |
| JP | 2001-035632 | 2/2001 |
| JP | 2001-53597 A | 2/2001 |
| JP | 2002-061781 | 8/2002 |
| KR | 0387552 B1 | 6/2003 |

OTHER PUBLICATIONS

KIPO Office action dated Jun. 22, 2010, in counterpart application KR10-2010-7006554 citing Foreign Patent Documents Nos. 1-2 above and US20040022044 which has been submitted in a previous IDS.

\* cited by examiner

TEST APPARATUS, PIN ELECTRONICS CARD, ELECTRICAL DEVICE AND SWITCH

CROSS REFERENCE TO RELATED APPLICATION

This is a continuation application of PCT/JP2006/320129 filed on Oct. 6, 2006 which claims priority from a Japanese Patent Application No. 2005-297823 filed on Oct. 12, 2005, the contents of which are incorporated herein by reference.

BACKGROUND

1. Technical Field

The present invention relates to a test apparatus for testing a device under test such as a semiconductor circuit. The present invention further relates to a pin electronics card, an electric device, and a switch for use with such a test apparatus. In particular, the present invention relates to a test apparatus or the like that protects an internal circuit from a surge etc.

2. Related Art

One test apparatus for testing a device under test such as a semiconductor circuit is an apparatus equipped with a pin electronics card exchanging signals with a device under test. The pin electronics card includes an internal circuit (e.g. driver comparator), and a switch (i.e. relay) switching whether to connect the internal circuit to the input/output pin of the device under test.

The transmission characteristic of the switch becomes an issue when a test signal of a high frequency is inputted to a device under test. In view of this, the switch is preferably small, for shortening the length of the transmission line. One example of the switch is an MEMS (Micro Electro Mechanical System) switch utilizing the MEMS technology.

The MEMS switch is provided with a cantilever formed by attaching two kinds of metal plates having different thermal expansion coefficients from each other, and functions as a switch by switching whether to heat the cantilever by means of a heater of the like. One example of the MEMS switch is a bimetal switch of a "normally-off" type, which is turned OFF while not heated, and turned ON when heated.

The heater for heating the cantilever is supplied with a source power from the power source of the pin electronics card. While a source power is not supplied to the pin electronics card (e.g. in transportation of the pin electronics card), the switch is in the OFF state, and so the internal circuit is cut off from outside. For this reason, even when a surge is caused at the external terminal of the pin electronics card attributable to static electricity or the like, the surge is not conveyed to the internal circuit so that the internal circuit is protected. We have not recognized any related patent documents or the like, and so the description thereof is omitted here.

However if a bimetal switch of a normally-off type is left in the OFF state for a long time, or is repeated to be ON and OFF, the amount of curvature in the OFF state of the cantilever deteriorates. When the amount of curvature in the OFF state of the cantilever deteriorates, a problem arises that the cantilever is mistakenly in contact with the fixed contact.

Moreover, the amount of curvature in the OFF state of the cantilever fluctuates according to the change in ambient temperatures. Accordingly, the contact pressure between the cantilever and the fixed contact when controlled to the ON state also fluctuates according to the ambient temperatures. Since the switching life of the contact depends on the contact pressure, it is preferable to operate the contact within a predetermined range of contact pressures. However if the range of contact pressures is determined, the ambient temperature in which the contact is usable will be accordingly limited.

Moreover, a bimetal switch includes a package section that contains a cantilever and a fixed contact in an airtight manner. The package section is formed by anodic bonding the silicon substrates at the side surfaces to the glass substrates at the front and the back surfaces. The anodic bonding is performed by applying a high voltage in a high temperature of about 200-400 degrees centigrade. In manufacturing a bimetal switch of a normally-off type, the high voltage is applied when the cantilever is in contact with the fixed contact, by the high temperature applied in the anodic bonding. When a high voltage is applied when the cantilever and the fixed contact are in contact with each other, there will be caused a problem of "soft stick" that the cantilever and the fixed contact are bonded to each other. This leads to deterioration of yield in production of pin electronics card that utilize a bimetal switch of the normally-off type.

SUMMARY

In view of this, it is an aspect related to the innovations herein to provide a test apparatus, a pin electronics card, an electric device, and a switch, which are able to overcome the above drawbacks accompanying the conventional art. The above object can be achieved by combinations described in the independent claims. The dependent claims define further advantageous and exemplary combinations of the present invention.

So as to solve the above-stated issues, according to an aspect related to the innovations herein, one exemplary test apparatus is a test apparatus for testing a device under test, the test apparatus including: a pattern generating section that inputs a test pattern to the device under test; a judging section that receives an output signal of the device under test, and makes judgment concerning pass/fail of the device under test based on the output signal; an internal circuit that exchanges signals between the device under test and the pattern generating section or the judging section; a first transmission line that connects the internal circuit to the device under test; and a first switch that connects the first transmission line to a ground potential in not testing the device under test, and cuts off the first transmission line from the ground potential in testing of the device under test.

According to an aspect of the present invention, one exemplary pin electronics card is a pin electronics card for exchanging signals with a device under test, in a test apparatus for testing the device under test, the pin electronics card including: an internal circuit that exchanges signals with the device under test; a first transmission line that connects the internal circuit to the device under test; and a first switch that connects the first transmission line to a ground potential in testing of the device under test, and cuts off the first transmission line from the ground potential in not testing the device under test.

According to an aspect of the present invention, one exemplary electric device is an electric device including: an internal circuit; a terminal electrically connected to outside: a transmission line connecting the internal circuit to the terminal; and a switch for connecting the transmission line to a ground potential when the internal circuit is not supplied with a source power, and for cutting off the transmission line from the ground potential when the internal circuit is supplied with a source power.

According to an aspect of the present invention, one exemplary switch is a switch for switching whether to electrically connect two conductors, the switch including: a first fixed contact connected to one of the conductors; a second fixed contact provided separate from the first fixed contact, and connected to the other of the conductors; a cantilever that switches whether to connect the first fixed contact to the second fixed contact; and a ground section provided in a periphery area of the first fixed contact and the second fixed contact, to be substantially parallel to the first fixed contact and the second fixed contact, the ground section being supplied with a ground potential, where the ground section includes a protrusion section that is provided to protrude from its end side substantially parallel to the first fixed contact and to the second fixed contact, to face the first fixed contact.

The summary of the invention does not necessarily describe all necessary features of the present invention. The present invention may also be a sub-combination of the features described above.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

Figure 1:
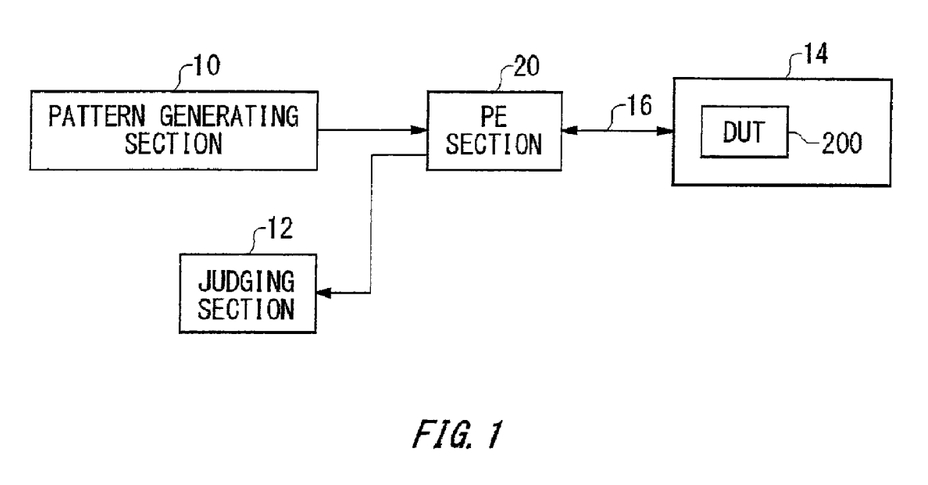
FIG. 1 shows an exemplary configuration of a test apparatus 100 according to an embodiment of the present invention.

FIG. 1 shows an exemplary configuration of a test apparatus 100 according to an embodiment of the present invention. The test apparatus 100 tests a device under test 200 such as a semiconductor circuit, and includes a pattern generating section 10, a judging section 12, a performance board 14, a cable section 16, and a pin electronics section 20.

The pattern generating section 10 generates a test pattern to be inputted to a device under test 200, for performing a functional test of the device under test 200. Here, the functional test is for example to input a test pattern to a device under test for causing the device under test 200 to perform a certain operation, thereby testing whether an output signal outputted from the device under test 200 matches a predetermined expected value or not.

The pattern generating section 10 inputs a test pattern to the device under test 200, via the pin electronics section 20. The judging section 12 receives the output signal of the device under test 200, via the pin electronics section 20, and makes judgment concerning pass/fail of the device under test 200 based on the output signal. For example, the pattern generating section 10 generates an expected value pattern that corresponds to the test pattern, and the judging section 12 makes judgment concerning pass/fail of the device under test 200, by comparing the output signal of the device under test 200 and the expected value pattern.

The pin electronics section 20 exchanges signals with the device under test 200. As described above, the pin electronics section 20 inputs the test pattern received from the pattern generating section 10 to the device under test 200. The pin electronics section 20 also receives the output signal from the device under test 200, and inputs the received output signal to the judging section 12. The pin electronics section 20 may include a plurality of input/output circuits that correspond to a plurality of input/output pins of the device under test 200, to exchange signals respectively with the input/output pins. The pin electronics section 20 may be provided in a removable manner with respect to the test apparatus 100, in the form of a pin electronics card.

The cable section 16 conveys signals between the pin electronics section 20 and the device under test 200. The cable section 16 may connect the input/output circuits of the pin electronics section 20 with the corresponding pins of the device under test 200, respectively. The performance board 14 conveys signals between the cable section 16 and the device under test 200 that is mounted to the performance board 14.

Figure 2:
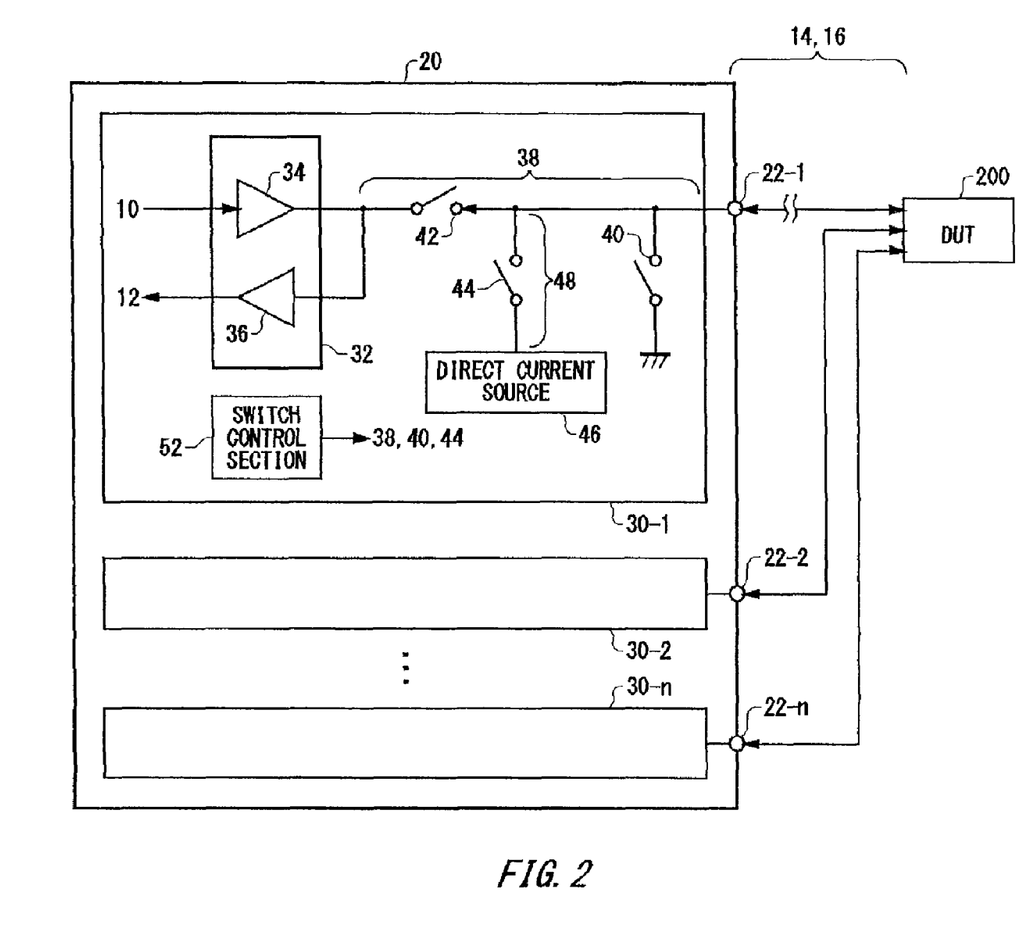
FIG. 2 shows an exemplary configuration of a pin electronics section 20.

FIG. 2 shows an exemplary configuration of the pin electronics section 20. As already described above, the pin electronics section 20 includes a plurality of input/output circuits (30-1-30-$n$, hereinafter occasionally collectively referred to as "30"), and a plurality of terminals (22-1-22-$n$, hereinafter occasionally collectively referred to as "22") for connecting the input/output circuits 30 to outside. Each terminal 22 is connected to a corresponding pin of the device under test 200, via the cable section 16 and the performance board 14.

Each input/output circuit 30 includes an internal circuit 32, a first transmission line 38, and a first switch 40. The internal circuit 32 exchanges signals with the device under test 200, and includes a driver 34 and a comparator 36 for example. The first transmission line 38 conveys a signal between the internal circuit 32 and the terminal 22-1. In the present example, the first transmission line 38 connects an output terminal of the driver 34 and an input terminal of the comparator 36, with the terminal 22-1.

The first switch 40 switches whether to connect the first transmission line 38 to a ground potential or not. The ground potential may be a potential common to a ground potential with respect to the internal circuit 32. In the present example, the first switch 40 connects the first transmission line 38 to the ground potential in not testing the device under test 200, and cuts off the first transmission line 38 from the ground potential in testing of the device under test 200. According to such a configuration, in not testing the device under test 200, even when a surge is caused in the terminal 22 due to static electricity or the like, it is still possible to run the surge to the ground potential, thereby protecting the internal circuit 32 from the surge.

For example when transporting the pin electronics section 20 by removing the same from the test apparatus 100, a surge may occur attributable to static electricity or the like. In this case, the pin electronics section 20 in the present example is able to render the first switch 40 to be the ON state, to connect the first transmission line 38 to the ground potential, and so is able to protect the internal circuit 32 from the surge occurring at the time of transportation.

For example, the first switch 40 may be a bimetal switch of a normally-on type which is brought to the OFF state when a source power is supplied to the pin electronics section 20, and is brought to the ON state when a source power is not supplied to the pin electronics section 20. When the first switch 40 is brought to the OFF state, the first transmission line 38 is cut off from the ground potential, and when the first switch 40 is brought to the ON state, the first transmission line 38 is connected to the ground potential.

The heater for heating the bimetal switch in the first switch 40 may heat the bimetal switch according to the source power supplied to the pin electronics section 20. According to such a configuration, when the pin electronics section 20 is not supplied with a source power, the first switch 40 is always in the ON state, and when the pin electronics section 20 is supplied with a source power, the first switch 40 is automatically brought to the OFF state.

In addition, at the time of removal of the device under test 200 from the pin electronics section 20 while the pin electronics section 20 is supplied with a source power, the switch control section 52 may control the first switch 40 to the ON state. For example, in case of replacing the device under test 200 after the end of testing the device under test 200, the switch control section 52 may control the first switch 40 to the ON state prior to the removal of the device under test 200 from the performance board 14. According to the stated control, it is possible to protect the internal circuit 32 from the surge occurring at the replacement of the device under test 200. In addition, the switch control section 52 may control the first switch 40 to the ON state after the end of a test of the device under test 200, and may control the first switch 40 to the OFF state prior to the start of the test of the device under test 200. A control apparatus for controlling the operation of the test apparatus 100 may notify the switch control section 52 of the timing of finishing and starting of the test, based on the test program for operating the test apparatus 100.

The pin electronics section 20 is provided between the first switch 40 and the internal circuit 32 on the first transmission line 38 and further includes a second switch 42 for switching whether to connect the device under test 200 to the internal circuit 32. For example, the second switch 42 may be a bimetal switch that is switched to the OFF state when the pin electronics section 20 is supplied with a source power, and is switched to the ON state when the pin electronics section 20 is not supplied with a source power. When the second switch 42 is brought to the OFF state, the internal circuit 32 is cut off from the terminal 22, and when the second switch 42 is brought to the ON state, the internal circuit 32 is connected to the terminal 22.

The switch control section 52 controls the second switch 42 to the ON state when causing the internal circuit 32 to transmit and receive signals in the state in which the source power is supplied to the pin electronics section 20. For example, when a functional test of the device under test 200 is performed, the switch control section 52 controls the second switch 42 to the ON state for causing the internal circuit 32 and the device under test 200 to perform reception/transmission of signals. A control apparatus for controlling the operation of the test apparatus 100 may notify the switch control section 52 of the timing of performing the functional test, based on the test program for operating the test apparatus 100.

In the present example, the driver 34 receives a test pattern from the pattern generating section 10, shapes the test pattern and output the result. The comparator 36 receives the output signal of the device under test 200, and outputs a signal resulting from comparing the output signal with a predetermined threshold voltage, to the judging section 12. For example, the comparator 36 outputs a signal indicating an H logic when the voltage value of the output signal is larger than the threshold voltage, and outputs a signal indicating an L logic when the voltage value of the output signal is smaller than the threshold voltage. In such a configuration, it is possible to perform a functional test of the device under test 200 by controlling the second switch 42 to the ON state. Since the pin electronics section 20 is supplied with a source power when a functional test of the device under test 200 is performed, the first switch 40 will be controlled to the OFF state.

Since the pin electronics section 20 in the present example uses a bimetal switch of a normally-on type as the second switch 42, the deterioration of the amount of curvature of the cantilever can be reduced even when the pin electronics section 20 is not supplied with a source power for a long time. In addition, the problem of soft stick in manufacturing the second switch 42 can be solved. Usually when using a normally-on switch as the second switch 42, the surge to the internal circuit 32 in transportation or the like of the pin electronics section 20 becomes an issue. According to the pin electronics section 20 in the present example, however, the first transmission line 38 is grounded via the first switch 40 of a normally-on type, and so the internal circuit 32 can be protected from the surge.

In addition, the pin electronics section 20 further includes a second transmission line 48, a direct current source 46, and a third switch 44. The direct current source 46 generates a source power for the device under test 200. The direct current source 46 may be provided in an input/output circuit 30 that corresponds to a power source pin of the device under test 200. In other words, an input/output circuit 30 that is not connected to the power source pin of the device under test 200 does not have to include a direct current source 46. A direct current source 46 of the input/output circuit 30 connected to the power source pin of the device under test 200 outputs a source power for driving the device under test 200.

The second transmission line 48 connects the first transmission line 38 to the direct current source 46. In addition, the second switch 42 is provided between the connection point between the first transmission line 38 and the second transmission line 48, and the internal circuit 32. The first switch 40 is provided between the connection point between the first transmission line 38 and the second transmission line 48, and the terminal 22, the first switch 40 being branched from the first transmission line 38. The third switch 44 is provided on the second transmission line 48, and switches whether to connect the first transmission line 38 with the direct current source 46.

For example, the third switch 44 may be a bimetal switch that is brought to the OFF state when the pin electronics section 20 is supplied with a source power, and is brought to the ON state when the pin electronics section 20 is not supplied with a source power When the third switch 44 is brought to the OFF state, the direct current source 46 is cut off from the first transmission line 38. When the third switch 44 is brought to the ON state, the direct current source 46 will be connected to the first transmission line 38.

In addition, when the device under test 200 is subjected to a direct current test in the state where the pin electronics section 20 is supplied with a source power, the switch control section 52 controls the third switch 44 to the ON state. For example in the direct current test, the fluctuation of the source current or the source voltage supplied to the device under test 200 when the device under test 200 is in operation is detected, and pass/fail of the device under test 200 is judged based on whether the source fluctuation falls within a predetermined range. A control apparatus for controlling the operation of the test apparatus 100 may notify the switch control section 52 of the timing of performing the direct current test, based on the test program for operating the test apparatus 100.

Since the pin electronics section 20 in the present example uses a bimetal switch of a normally-on type as the third switch 44, the deterioration of the amount of curvature of the cantilever can be reduced even when the pin electronics section 20 is not supplied with a source power for a long time. In addition, the problem of soft stick in manufacturing the third switch 44 can be solved. Usually when using a normally-on switch as the third switch 44, the surge to the direct current source 46 in transportation or the like of the pin electronics section 20 becomes an issue. According to the pin electronics section 20 in the present example, however, the first transmission line 38 is grounded via the first switch 40 of a normally-on type, and so the direct current source 46 can be protected from the surge.

As described above, in the pin electronics section 20 in the present example, both of the second switch 42 and the third switch 44 are a switch that has a reduced deterioration amount of cantilever curvature and has overcome a problem of soft stick during manufacturing, and so the internal circuit 32 and the direct current source 46 can be protected from the surge.

Figure 3A:
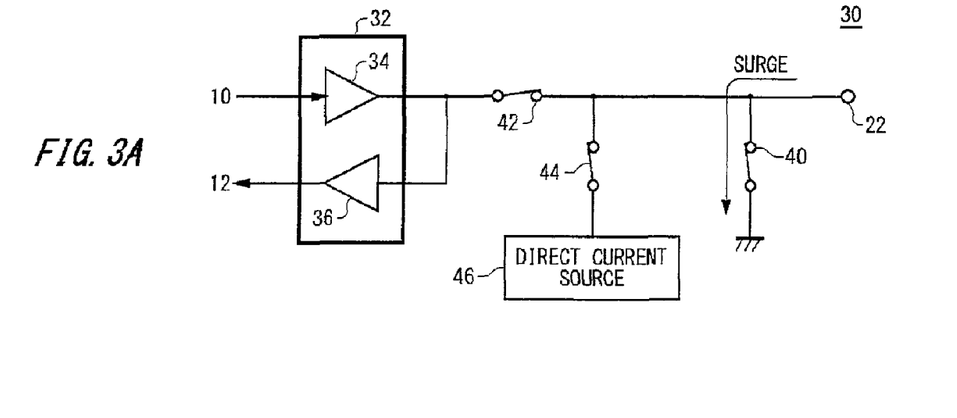
FIG. 3A shows an exemplary operation when the pin electronics section 20 is not supplied with a source power.
Figure 3B:
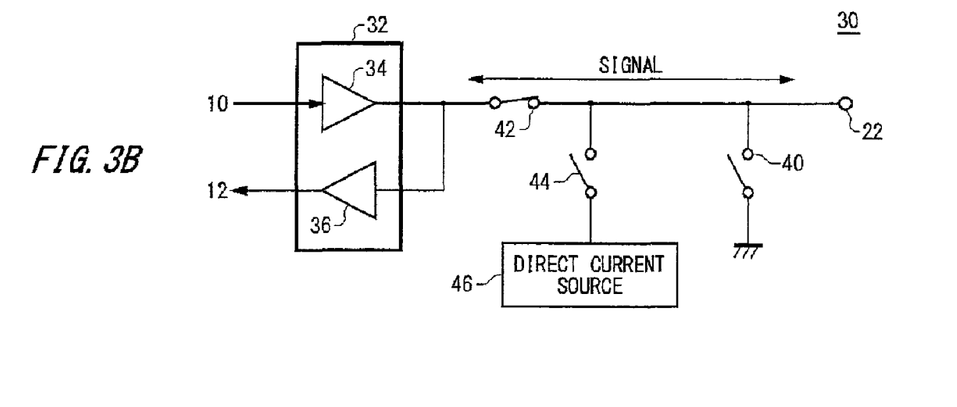
FIG. 3B shows an exemplary operation of the input/output circuit 30 when a device under test 200 is subjected to a functional test.
Figure 3C:
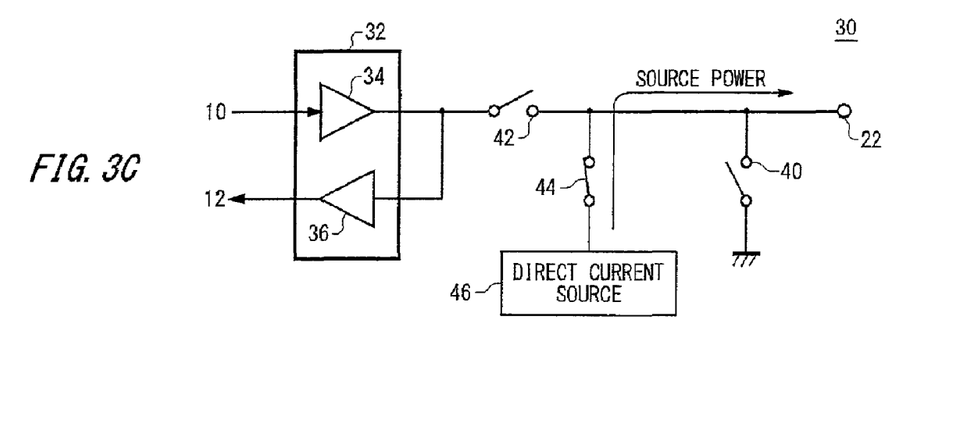
FIG. 3C shows an exemplary operation of the input/output circuit 30 when the device under test 200 is subjected to a direct current test.

FIGS. 3A, 3B, and 3C show an exemplary operation of an input/output circuit 30. FIG. 3A shows an exemplary operation when the pin electronics section 20 is not supplied with a source power. Since the first switch 40, the second switch 42, and the third switch 44 are a switch of a normally-on type as described above, and so they are controlled to the ON state in this example. According to such a configuration, even when a surge is applied from outside during transportation of the pin electronics section 20 for example, the internal circuit 32 and the direct current source 46 are able to be protected. In addition, even when the pin electronics section 20 is not supplied with a source power for a long time, it is possible to reduce the deterioration of the amount of curvature of the cantilever, for the first switch 40, the second switch 42, and the third switch 44.

FIG. 3B shows an exemplary operation of the input/output circuit 30 when a device under test 200 is subjected to a functional test. In this case, the pin electronics section 20 is supplied with a source power, and so the first switch 40, the second switch 42, and the third switch 44 will be brought to the OFF state. Then the switch control section 52 controls the second switch 42 to the ON state. For example, the switch control section 52 may cut off the source power to be supplied to the heater of the second switch 42, when the device under test 200 is subjected to a functional test. According to the stated control, it is possible to perform the functional test of the device under test 200.

FIG. 3C shows an exemplary operation of the input/output circuit 30 when the device under test 200 is subjected to a direct current test. In this case, the pin electronics section 20 is supplied with a source power, and so the first switch 40, the second switch 42, and the third switch 44 will be brought to the OFF state. Then the switch control section 52 controls the third switch 44 to the ON state. For example, the switch control section 52 may cut off the source power from the heater of the third switch 44, when the device under test 200 is subjected to a direct current test. According to the stated control, it is possible to perform the direct current test of the device under test 200.

Figure 4:
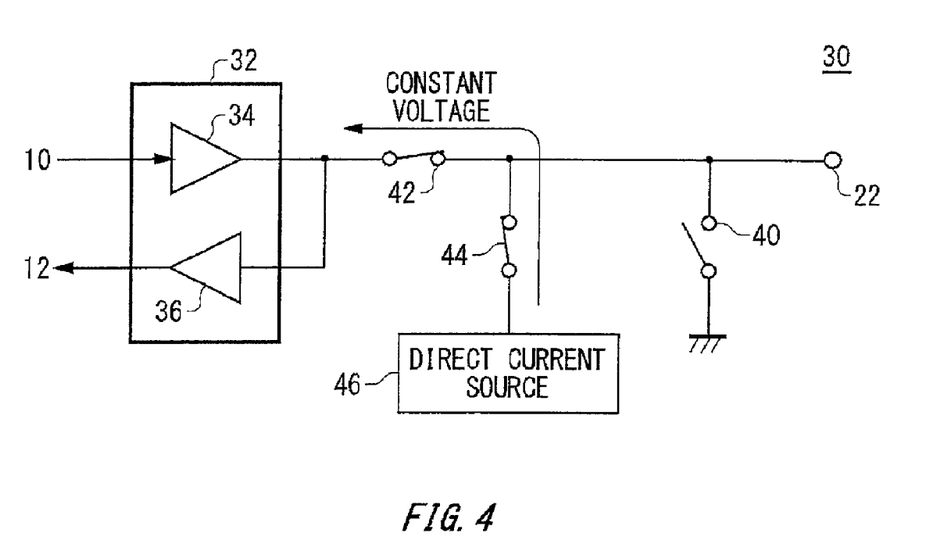
FIG. 4 shows an exemplary operation of the input/output circuit 30.

FIG. 4 shows an exemplary operation of the input/output circuit 30. The present example shows an exemplary operation in a case where calibration of the internal circuit 32 is performed. In this case, the pin electronics section 20 is supplied with a source power, and so the first switch 40, the second switch 42, and the third switch 44 will be brought to the OFF state. Then the switch control section 52 controls the second switch 42 and the third switch 44 to the ON state. For example, the switch control section 52 may cut off the source power from the heater of the second switch 42 and the heater of the third switch 44, when calibration of the internal circuit 32 is performed with use of the direct current source 46.

For example, when calibration of the internal circuit 32 is performed, the direct current source 46 generates a predetermined voltage. The comparator 36 compares the voltage with a given threshold voltage, and outputs the comparison result. A control apparatus for controlling the test apparatus 100 adjusts the threshold voltage to be given to the comparator 36, based on the comparison result. According to such a control, it is possible to reduce the variation of the operation of the comparator 36 in each input/output circuit 30.

In addition, after adjusting the threshold voltage of the comparator 36, the driver 34 is controlled to output a predetermined voltage. Then the comparator 36 compares the output voltage of the driver 34 with the threshold voltage. The control apparatus adjusts the voltage outputted from the driver 34, based on the comparison result. According to such a control, it is possible to reduce the variation of the operation of the driver 34 in each input/output circuit 30.

Figure 5:
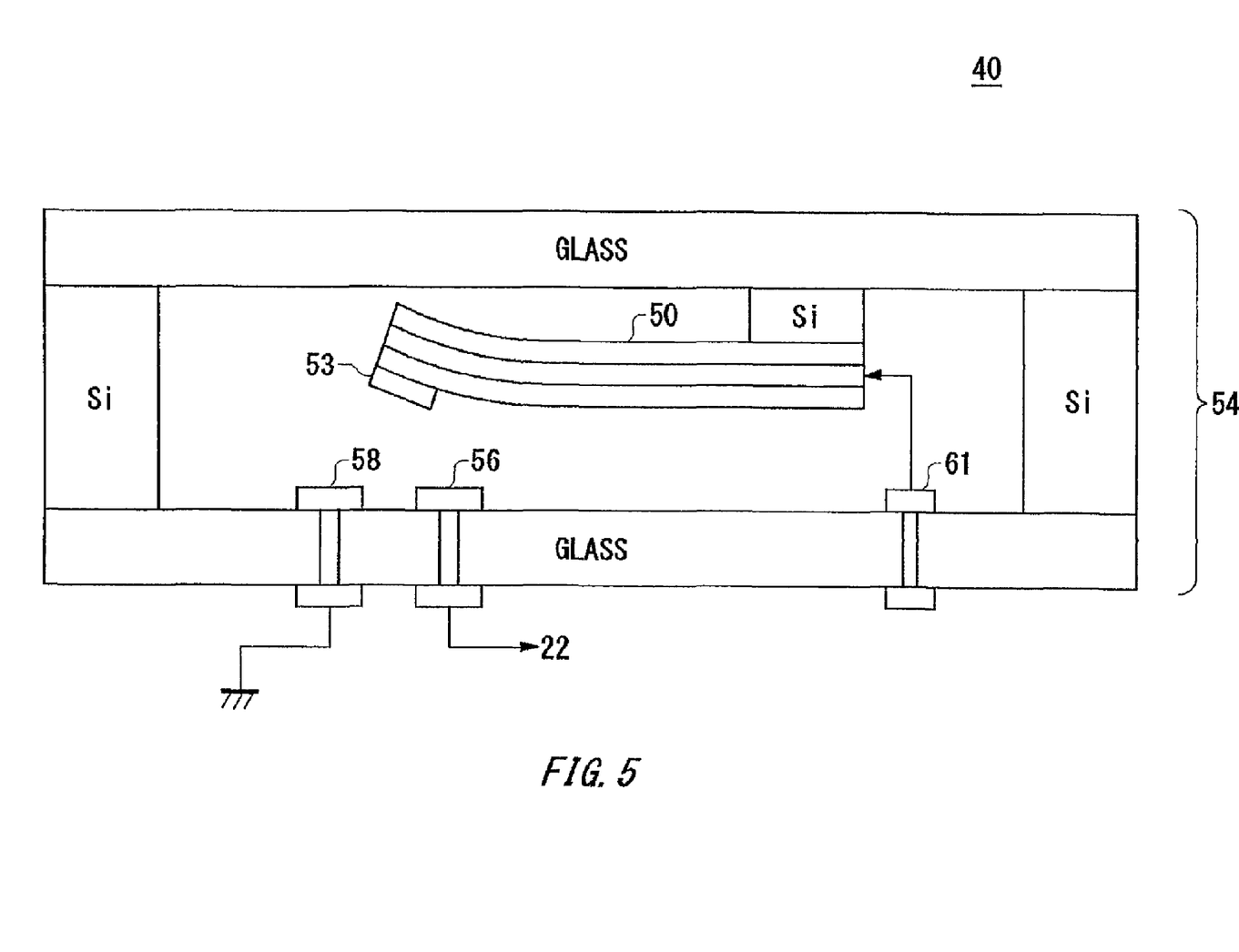
FIG. 5 shows an exemplary configuration of a first switch 40.

FIG. 5 shows an exemplary configuration of a first switch 40. FIG. 5 shows a sectional view of the first switch 40. In the present example, the first switch 40 is an MEMS switch of a bimetal type, and includes a package section 54, a cantilever 50, a variable contact 53, a first fixed contact 56, a second fixed contact 58, and a heater electrode 61.

The package section 54 includes, in an airtight manner, the cantilever 50, the variable contact 53, the first fixed contact 56, the second fixed contact 58, and the heater electrode 61. The package section 54 has glass substrates at the front and rear surfaces thereof, and has silicon substrates at the side surfaces. The glass substrates and the silicon substrates are bonded by anodic bonding.

The first fixed contact 56 is electrically connected to the first transmission line. The second fixed contact 58 is provided separately from the first fixed contact 56, and is electrically connected to the ground potential. The variable contact 53 is provided to the tip of the cantilever 50, to face to the first fixed contact 56 and the second fixed contact 58.

The cantilever 50 switches whether to bring the variable contact 53 into contact with the first fixed contact 56 and the second fixed contact 58, according to the power given from the heater electrode 61. For example, the cantilever 50 may have a bimetal structure that is formed by attaching, to each other, metal plates having different thermal expansion coefficients from each other and that is driven by the heat caused by the power supplied from the heater electrode 61. In a different example, the cantilever 50 may have a bimetal (bimorph) structure that is formed by attaching a piezo electric element to a metal plate, and that is driven by the voltage supplied from the heater electrode 61.

Figure 6:
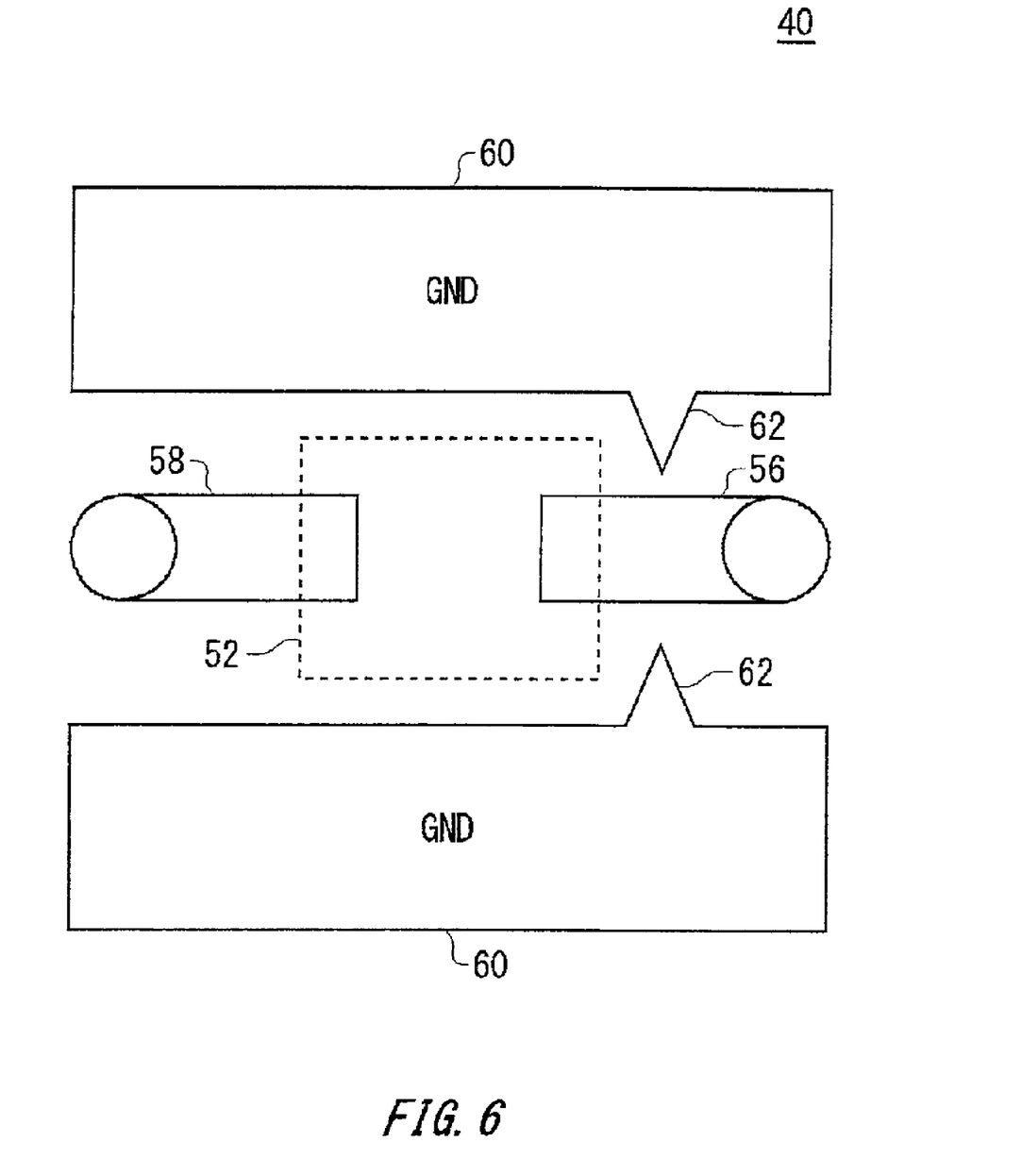
FIG. 6 is a top view of a first fixed contact 56 and a second fixed contact 58, which are provided for the first switch 40.

FIG. 6 is a top view of a first fixed contact 56 and a second fixed contact 58, which are provided for the first switch 40. As shown in FIG. 6, the first fixed contact 56 and the second fixed contact 58 are provided along the same straight line. In addition, ground sections 60 supplied with a ground potential are provided in periphery areas of the first fixed contact 56 and the second fixed contact 58, to be substantially parallel to the first fixed contact 56 and the second fixed contact 58. For example, the ground sections 60 may be provided at both sides of the straight line along which the first fixed contact 56 and the second fixed contact 58 align, to be parallel to the straight line.

In addition, a ground section 60 includes a protrusion section 62 provided to protrude from its end side substantially parallel to the first fixed contact 56 and to the second fixed contact 58, to face the first fixed contact 56. The protrusion section 62 is provided to have a gradually narrowing width from the position of the ground section 60 that faces the first fixed contact 56, towards the first fixed contact 56. The protrusion section 62 may have a tip having an acute angle. In addition, the protrusion section 62 may be provided for each of the ground sections 60 provided for both sides of the first fixed contacts 56.

According to such a configuration, even when a surge is caused while the first switch 40 is controlled to the OFF state during a test of the device under test 200 or the like, the surge can be discharged between the protrusion section 62 and the first fixed contact 56. In addition, the package section 54 may have sealed therein a discharge gas. Here, the discharge gas may be a gas such as neon, argon, xenon, and helium, or may be a mixture of these gases. By sealing in these types of discharge gases, it is possible to facilitate discharge of the surge.

In addition, the ground section 60 may further include a protrusion section 62 that faces the second fixed contact 58, in addition to the protrusion section 62 that faces the first fixed contact 56. Although the present example has explained the configuration of the first switch 40, the second switch 42 and the third switch 44 may also have the same configuration as the first switch 40. For example, the second switch 42 has a configuration such that the first fixed contact 56 is electrically connected to the terminal 22, and the second fixed contact 58 is electrically connected to the internal circuit 32. In addition, the third switch 44 has such a configuration that the first fixed contact 56 is electrically connected to the first transmission line 38, and the second fixed contact 58 is electrically connected to the direct current source 46, for example.

In addition, it is desirable that the protrusion section 62 is provided to discharge a surge without discharging a signal or a power that should be transmitted in testing of the device under test 200. The voltage of the surge is much higher than those of a signal and a power used in the testing, and so it becomes possible to selectively discharge the surge by adjusting the distance between the tip of the protrusion section 62 and the fixed contact. In addition, the selective discharge of the surge may also be performed by adjusting the pressure, the gas composition ratio, or the like of the discharge gas to be sealed in the package section 54. By adopting a switch having the stated configuration, it is possible to protect the internal circuit 32 or the like, also from the surge generated during testing of the device under test 200 or the like.

Figure 7:
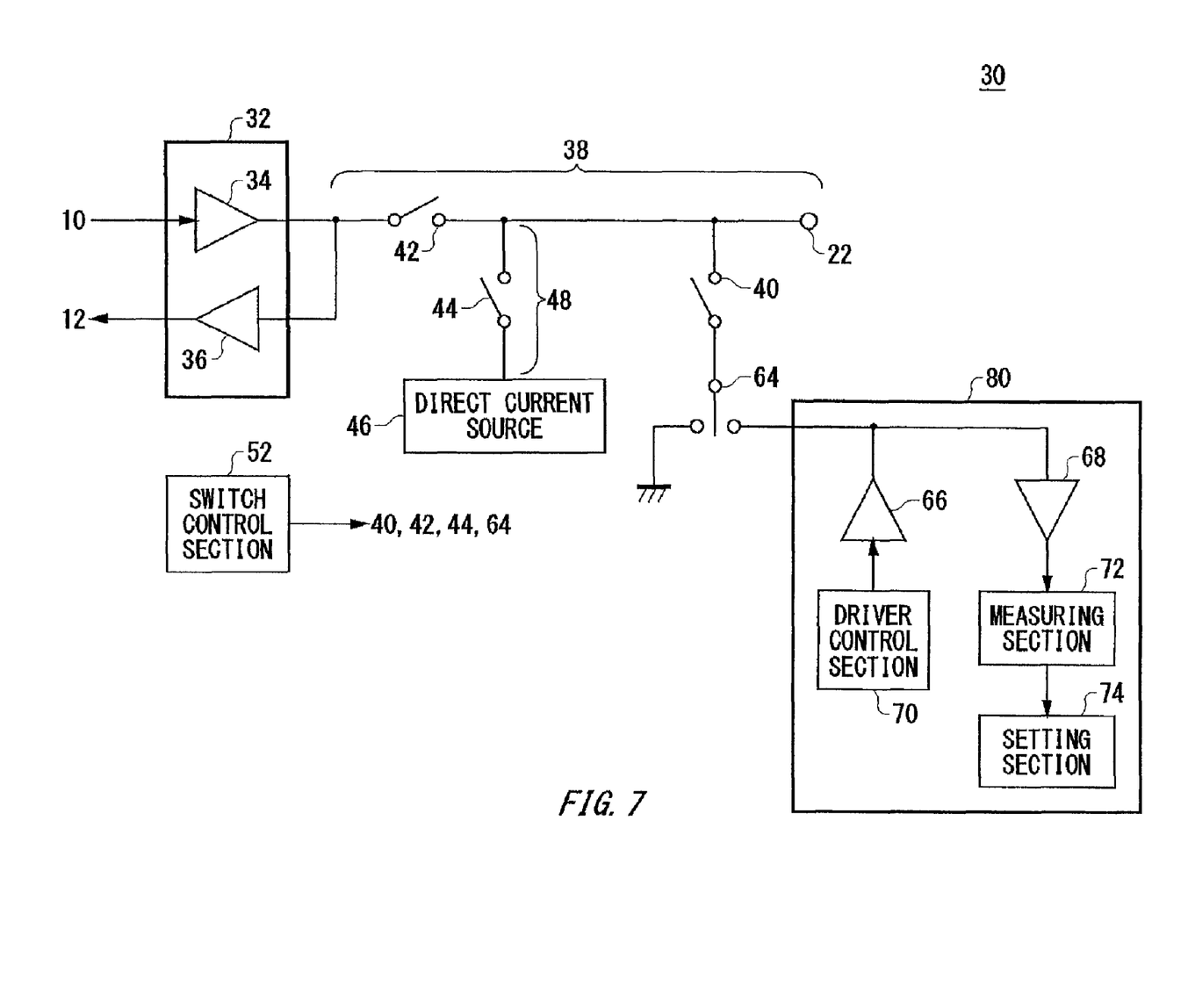
FIG. 7 shows another exemplary configuration of each input/output circuit 30.

FIG. 7 shows another exemplary configuration of each input/output circuit 30. The input/output circuit 30 in the present example is further equipped with a calibration section 80 and a fourth switch 64, in addition to the configuration of the input/output circuit 30 explained with reference to FIG. 2. The calibration section 80 adjusts the timing at which each of the input/output circuits 30 outputs a signal and the timing at which the input/output circuit 30 detects a signal, based on a transmission delay time between the input/output circuit 30 and the device under test 200.

The fourth switch 64 switches whether to connect the ground potential or the calibration section 80, to the first switch 40. The switch control section 52 controls the fourth switch when calibrating the input/output circuit 30 by means of the calibration section 80, and causes the first switch 40 to be connected to the calibration section 80. In performing the calibration, the switch control section 52 also controls the first switch 40 to the ON state, and controls the second switch 42 and the third switch 44 to the OFF state.

The calibration section 80 includes a reference driver 66, a reference comparator 68, a driver control section 70, a measuring section 72, and a setting section 74. The reference driver 66 outputs a signal of a predetermined waveform. For example, the driver control section 70 controls the reference driver 66 to output a reference signal having a predetermined pulse width.

The reference signal is transmitted to the performance board 14 via the terminal 22 and the cable section 16. In performing the calibration, a performance board for calibration, which is provided with a tail section for reflecting a reference signal, may be used as the performance board 14. It is desirable that the tail section reflects the reference signal without reversing the polarity of the reference signal. The reference signal is reflected at the performance board 14 and is inputted to the reference comparator 68 via the cable section 16 and the terminal 22.

The signal input end of the reference comparator 68 is connected to the signal output end of the reference driver 66. That is, a composite waveform being a combination between the reference signal outputted from the reference driver 66 and the reflected signal resulting from reflection of the reference signal at the device side end of the cable section 16 is inputted to the reference comparator 68.

The measuring section 72 measures a signal delay amount at the cable section 16, based on the composite waveform detected by the reference comparator 68. For example, the measuring section 72 measures the signal delay amount based on the pulse width of the composite waveform detected by the reference comparator 68.

The setting section 74 calibrates the internal circuit 32 based on the signal delay amount measured by the measuring section 72. For example, the setting section 74 may adjust the timing at which each internal circuit 32 outputs a signal and the timing at which each internal circuit 32 detects a signal, based on the difference in the signal delay amount measured in each input/output circuit 30. The timing at which the internal circuit 32 outputs a signal can be adjusted by controlling the phase of the timing clock supplied to the driver 34, for example. The timing at which the internal circuit 32 detects a signal can be adjusted by controlling the phase of a strobe signal supplied to the comparator 36, for example. In addition, it is also possible to provide a variable delay circuit to the input/output end of the internal circuit 32, so that the setting section 74 controls the delay amount for the variable delay circuit.

According to the stated configuration, it becomes possible to perform timing calibration of each input/output circuit 30. In addition, the fourth switch 64 may be a bimetal switch that connects the first switch 40 to the ground potential when a source power is not supplied to the pin electronics section 20, and that connects the first switch 40 to the calibration section 80 when a source power is supplied to the pin electronics section 20.

In this case, at the time of transportation of the pin electronics section 20 or the like, the first transmission line 30 is connected to the ground potential via the first switch 40 and the fourth switch 64, and so it is possible to protect the internal circuit 32 from a surge. In addition, the calibration section 80 can also be protected from a surge since the calibration section 80 is also cut off from the first transmission line 30.

In addition, in testing of the device under test 200, the first switch 40 will be brought to the OFF state, and so the calibration section 80 does not affect the test of the device under test 200. When the calibration of the internal circuit 32 is performed using the calibration section 80, the pin electronics section 20 will be supplied with a source power, and so the switch control section 52 controls the first switch 40 to the ON state.

Figure 8:
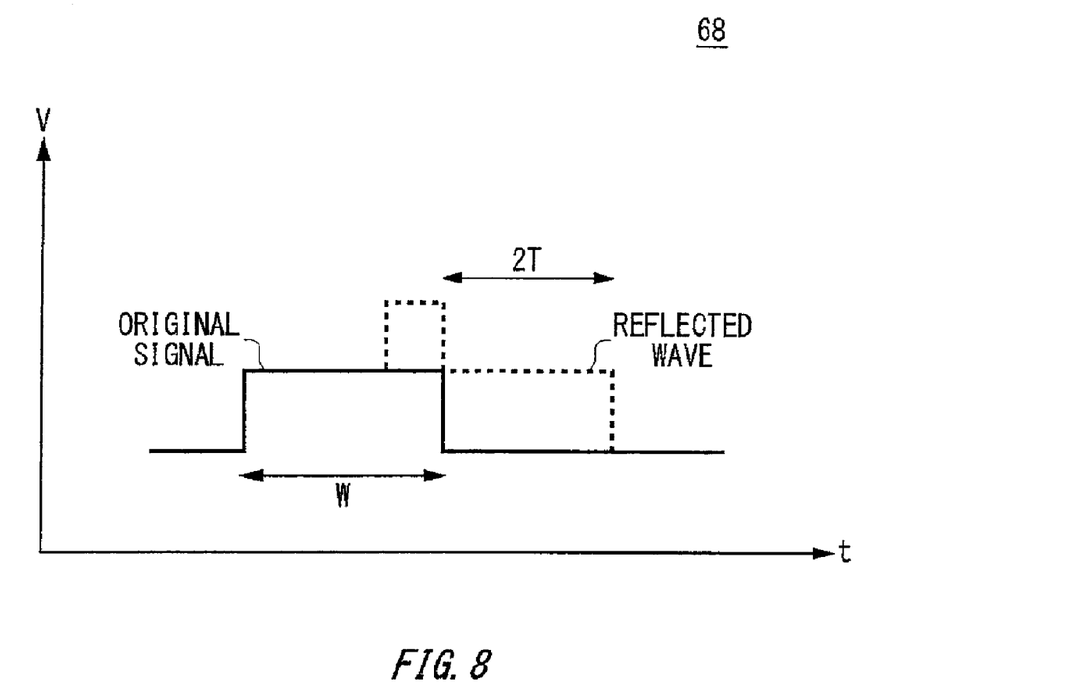
FIG. 8 shows one example of a composite waveform detected by a reference comparator 68.

FIG. 8 shows one example of a composite waveform detected by a reference comparator 68. In FIG. 8, the waveform of the reference signal outputted by the reference driver 66 is shown by a solid line, and the reflected waveform is shown by a broken line. Also in FIG. 8, the pulse width of a reference signal is represented as "W", and the signal delay amount at the cable section 16 is represented as "T".

Since the signal delay amount at the cable section 16 is "T", the phase of the reflected waveform inputted to the reference comparator 68 is delayed by the amount of "2T" from the phase of the reference signal. As a result, the pulse width of the signal detected by the reference comparator 68 will be "W+2T". The measuring section 72 is able to calculate the signal delay amount "T" by subtracting the pulse width of the reference signal, from the pulse width of the signal detected by the reference comparator 68, and dividing the subtraction result by 2.

Figure 9:
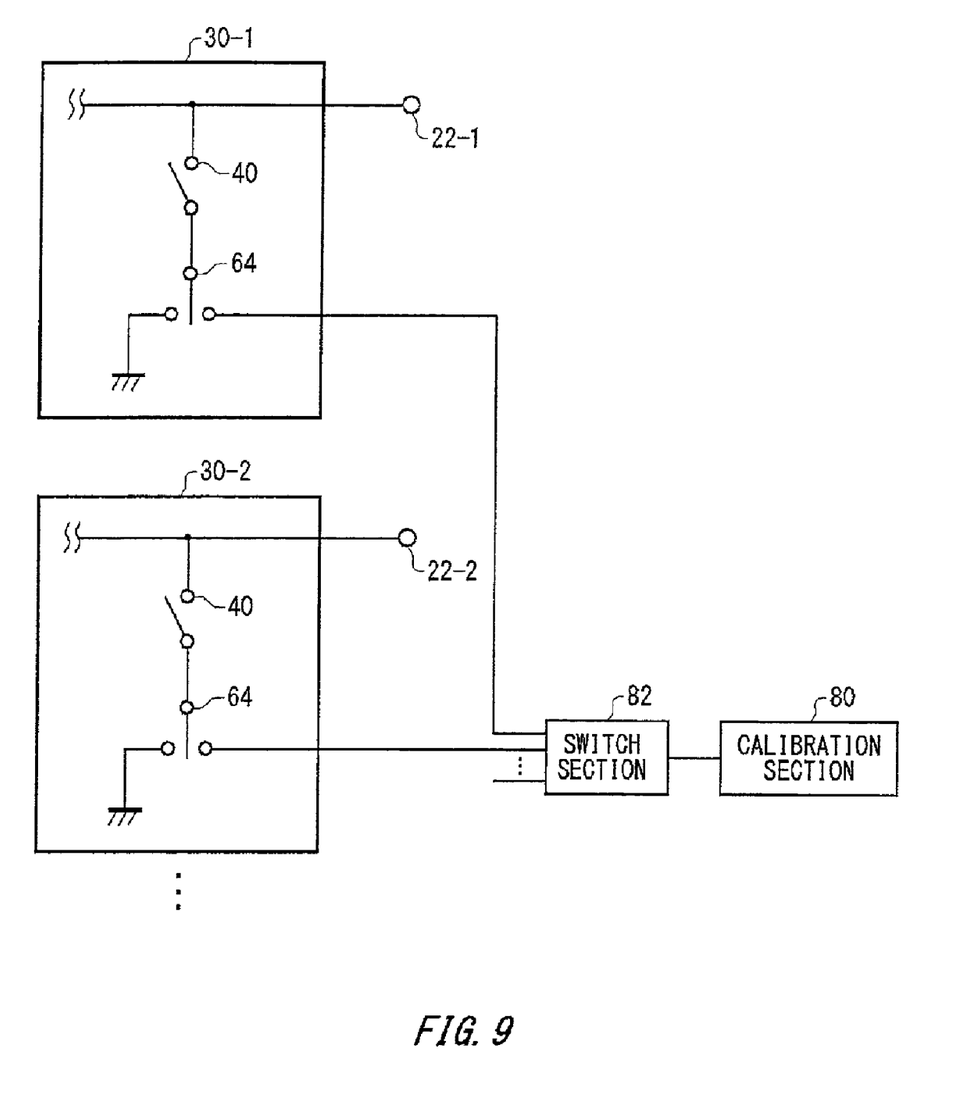
FIG. 9 shows another exemplary configuration of the pin electronics section 20.

FIG. 9 shows another exemplary configuration of the pin electronics section 20. FIG. 7 has dealt with a case where each of the input/output circuits 30 includes a calibration section 80, while the present example deals with a case where the pin electronics section 20 includes a calibration section 80 and a switch section 82 collectively with respect to the plurality of input/output circuits 30.

The switch section 82 switches between connection destinations of the signal output end of the reference driver 66 included in the calibration section 80, where the connection destinations are the first switches 40 respectively of the input/output circuits 30. In the present example, the switch section 82 connects the calibration section 80 to the first switch 40 via the fourth switch 64.

The switch section 82 sequentially connects the calibration section 80 to each input/output circuit 30. The calibration section 80 sequentially measures the signal delay amount of the cable section 16 corresponding to each input/output circuit 30, to sequentially calibrate each internal circuit 32. For example, the calibration section 80 calibrates each internal circuit 32 so that the timing of inputting and outputting the signal for each internal circuit 32 be a predetermined timing.

Figure 10:
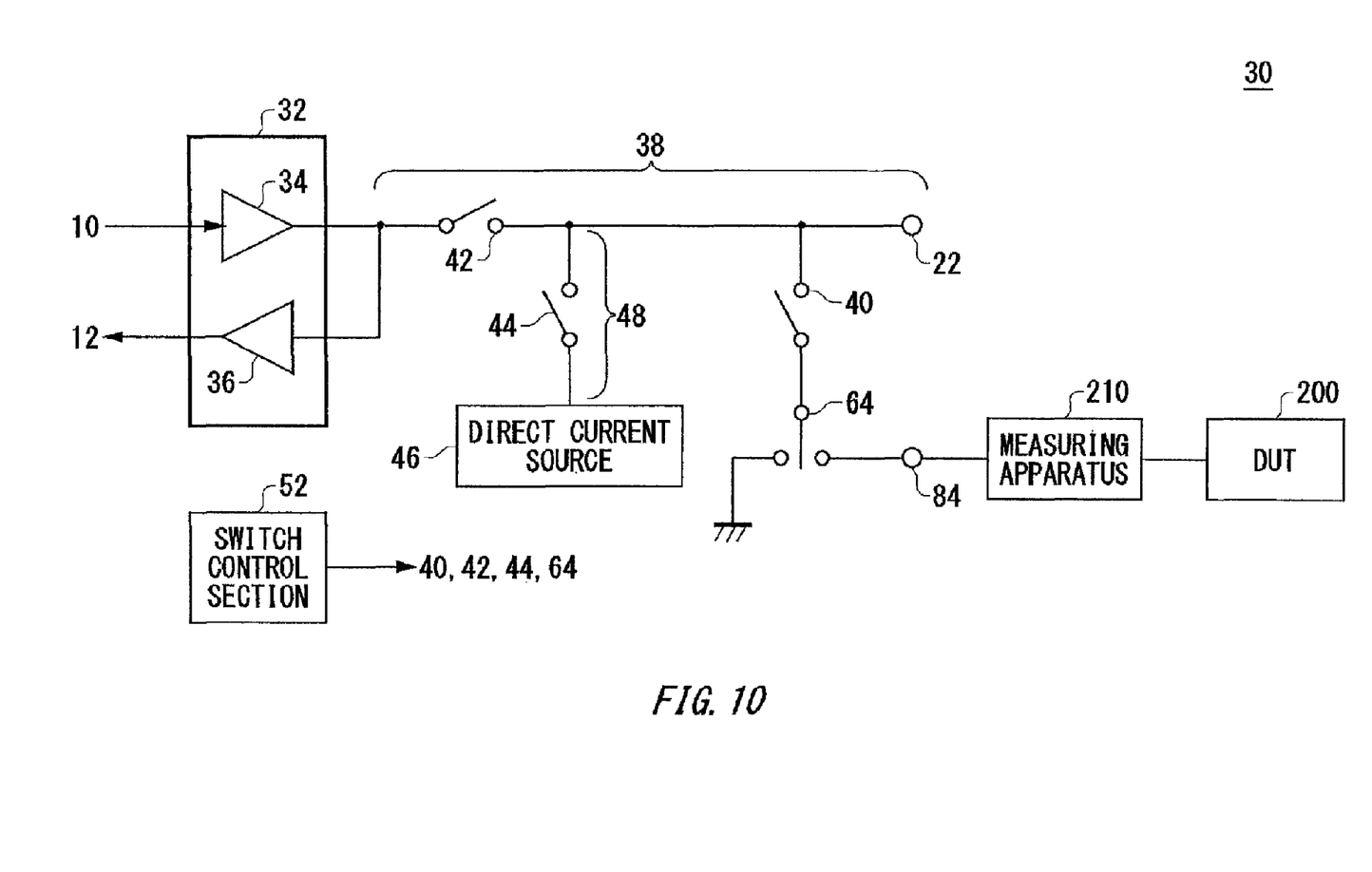
FIG. 10 shows another exemplary configuration of each input/output circuit 30.

FIG. 10 shows another exemplary configuration of each input/output circuit 30. The input/output circuit 30 in the present example further includes a connection port 84 and a fourth switch 64, in addition to the configuration of the input/output circuit 30 explained above with reference to FIG. 2. The connection port 84 is connected to an external measuring apparatus 210 such as an oscilloscope.

The measuring apparatus 210 measures the waveform of an output signal of the device under test 200, and inputs the measurement result to the input/output circuit 30 via the connection port 84. The configuration and function of the fourth switch 64 are substantially the same as those of the fourth switch 64 shown in FIG. 7.

According to the stated configuration, it becomes easy to connect the test apparatus 100 to the external measuring apparatus 210. In addition, the measuring apparatus 210 such as an oscilloscope is able to measure the waveform of an output signal more accurately, which makes it possible to test the device under test 200 more accurately.

Although some aspects of the present invention have been described by way of exemplary embodiments, it should be understood that those skilled in the art might make many changes and substitutions without departing from the spirit and the scope of the present invention which is defined only by the appended claims.

For example, the embodiment has been described by taking the pin electronics section 20 that includes the internal circuit 32 as an example. However, the embodiment of protecting an internal circuit from a surge is not limited to the example of the pin electronics section 20. In fact, the embodiment also includes an example of an electric device that includes an internal circuit, a terminal electrically connected to outside, and a transmission line electrically connecting the internal circuit to the terminal. In this exemplary embodiment, it is possible to protect the internal circuit from a surge or the like, by providing a switch that connects the transmission line to the ground potential when the internal circuit is not supplied with a source power, and that cuts off the transmission line from the ground potential when the internal circuit is supplied with a source power.

As clear from the above description, the test apparatus 100 is able to protect the internal circuit from a surge or the like. In addition, according to the test apparatus 100, it is possible to reduce the deterioration in the amount of curvature for the cantilever and the problem of soft sticks, which are attributable to the usage of a bimetal switch in the pin electronics or the like of the test apparatus.

What is claimed is:

1. An electric device comprising:
   an internal circuit;
   a terminal electrically connected to outside;
   a first transmission line connecting the internal circuit to the terminal;
   a first switch that connects the first transmission line to a ground potential when the internal circuit is not supplied with a source power, and cuts off the first transmission line from the ground potential when the internal circuit is supplied with the source power;
   a reference driver that outputs a predetermined signal;
   a reference comparator whose signal input end is connected to a signal output end of the reference driver;
   a fourth switch that switches the first switch either to be connected to the ground potential or to the signal output end of the reference driver; and
   a calibration section that performs calibration, when the terminal is not connected to an external device, wherein the calibration section includes:
      a switch control section that controls the fourth switch to connect the first switch to the reference comparator;
      a driver control section that controls the reference driver to output a predetermined reference signal;
      a measuring section that measures a signal delay amount between the terminal and the external device, based on a composite waveform detected by the reference comparator, the composite waveform being a combination between the reference signal outputted from the reference driver and a reflected signal at the external device; and
      a setting section that calibrates the internal circuit based on the signal delay amount.

2. The electric device as set forth in claim 1, wherein
the first switch is brought to the OFF state when the internal circuit is supplied with the source power, and is brought to the ON state when the internal circuit is not supplied with the source power.

3. The electric device as set forth in claim 2, further comprising
a switch control section that controls the first switch to the ON state at a time of removal of an external device from the terminal under a state where the internal circuit is supplied with the source power.

4. The electric device as set forth in claim 3, further comprising
a second switch that is provided between the first switch and the internal circuit on the first transmission line and that switches whether to connect the terminal to the internal circuit.

5. The electric device as set forth in claim 4, wherein
the second switch is brought to the OFF state when the internal circuit is supplied with the source power, and is brought to the ON state when the internal circuit is not supplied with the source power.

6. The electric device as set forth in claim 5, wherein
the switch control section controls the second switch to the ON state when the terminal is connected to the external device, and controls the second switch to the OFF state when the terminal is not connected to the external device.

7. The electric device as set forth in claim 6, further comprising
a second transmission line that connects the first transmission line to a direct current source, wherein
the second switch is provided, on the first transmission line, between the internal circuit and a connection point connecting the first transmission line and the second transmission line.

8. The electric device as set forth in claim 7, further comprising
a third switch that is provided on the second transmission line and that switches whether to connect the first transmission line to the direct current source.

9. The electric device as set forth in claim 8, wherein
the third switch is brought to the OFF state when the internal circuit is supplied with the source power, and is brought to the ON state when the internal circuit is not supplied with the source power.

10. The electric device as set forth in claim 9, wherein the switch control section
a) controls the second switch to the ON state and the third switch to the OFF state when the terminal exchanges signals with the internal circuit;
b) controls the second switch to the OFF state and the third switch to the ON state when the terminal is supplied with direct current from the direct current source; and
c) controls the second switch and the third switch to the ON state when the internal circuit is calibrated.

\* \* \* \* \*